(12) United States Patent  
Trager et al.

(10) Patent No.: US 9,136,824 B2  
(45) Date of Patent: Sep. 15, 2015

(54) FREQUENCY MANAGEMENT USING SAMPLE RATE CONVERSION

(71) Applicant: Silicon Laboratories Inc., Austin, TX (US)

(72) Inventors: David Trager, Buda, TX (US); Zhongchun Liu, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 69 days.

(21) Appl. No.: 14/152,133

(22) Filed: Jan. 10, 2014

(65) Prior Publication Data  
US 2015/0200649 A1 Jul. 16, 2015

(51) Int. Cl.  
*H03M 7/00* (2006.01)  
*H03H 17/06* (2006.01)  
*H03M 1/06* (2006.01)  
*H03M 1/12* (2006.01)

(52) U.S. Cl.  
CPC ........ *H03H 17/0628* (2013.01); *H03M 1/0614* (2013.01); *H03M 1/125* (2013.01)

(58) Field of Classification Search  
CPC ........... H03M 1/06; H03M 1/10; H03M 1/66; H03M 1/74; H03M 1/84; H03M 1/664; H03M 1/1061; H03M 1/0692; H05B 33/08; H05B 33/086; H05B 39/00; G09G 3/32  
USPC ............... 341/55–70; 375/267, 346; 386/233, 386/224, 307, 327, 359  
See application file for complete search history.

(56) References Cited

U.S. PATENT DOCUMENTS

| | | | |
|---|---|---|---|
| 5,668,830 A | 9/1997 | Georgiou et al. | |
| 6,218,948 B1 * | 4/2001 | Dana | 340/604 |
| 6,298,400 B1 | 10/2001 | Candelore | |
| 6,424,787 B2 * | 7/2002 | Watanabe et al. | 386/233 |
| 6,441,860 B1 | 8/2002 | Yamaguchi et al. | |
| 6,661,251 B1 | 12/2003 | Dowen et al. | |
| 6,687,315 B2 | 2/2004 | Keevill et al. | |
| 6,792,003 B1 | 9/2004 | Potluri et al. | |
| 7,339,503 B1 * | 3/2008 | Elenes et al. | 341/61 |
| 7,339,504 B1 * | 3/2008 | Li et al. | 341/61 |
| 7,778,370 B2 | 8/2010 | Aytur et al. | |
| 8,027,394 B2 | 9/2011 | Nicolas | |

(Continued)

OTHER PUBLICATIONS

U.S. Appl. No. 14/061,084, filed Oct. 23, 2013, entitled "Synchronizing Orthogonal Frequency Division Multiplexed (OFDM) Symbols in a Receiver," by Javier Elenes.

European Broadcasting Union, "Digital Video Broadcasting (DVB); Framing structure, channel coding and modulation for digital terrestrial television," European Standard (Telecommunication Series), 2004, 64 pages.

Silicon Laboratories, "SiRX Single-Chip RF Front-End for Digital Satellite TV," Nov. 2005, 10 pages.

Silicon Laboratories, "Si2107/08/09/10," Jun. 2006, pp. 21-28.

*Primary Examiner* — Lam T Mai  
(74) *Attorney, Agent, or Firm* — Trop, Pruner & Hu, P.C.

(57) ABSTRACT

In one embodiment, an apparatus includes a first receiver path with a first digitizer to digitize an incoming signal obtained from a radio frequency signal including at least a first desired channel into samples, the first digitizer to operate at a first sampling frequency, a first sample rate converter coupled to an output of the first digitizer to receive the samples at the first sampling frequency and to output the samples at a fixed sampling frequency, and a first digital processor to receive and process the samples at the fixed sampling frequency. The apparatus may further include a controller to receive a frequency change indication and to dynamically control the first sample rate converter to accommodate a change in the first sampling frequency from a first rate to a second rate.

21 Claims, 7 Drawing Sheets

(56) References Cited

U.S. PATENT DOCUMENTS

| | | |
|---|---|---|
| 8,605,224 B2 | 12/2013 | Trager |
| 8,804,865 B2 * | 8/2014 | Elenes et al. ............... 375/267 |
| 2003/0044166 A1 | 3/2003 | Haddad |
| 2006/0001779 A1 | 1/2006 | Favrat et al. |
| 2007/0230513 A1 | 10/2007 | Talbot et al. |
| 2014/0267925 A1 | 9/2014 | Koroglu et al. |
| 2014/0267928 A1 | 9/2014 | Coban et al. |

* cited by examiner

FREQUENCY MANAGEMENT USING SAMPLE RATE CONVERSION

BACKGROUND

In a mixed signal environment, switching noise from clocked and discrete-time elements creates noise that couples into sensitive analog nodes, such as of a radio frequency (RF) receiver. Due to the rapid switching, harmonics of the switching frequencies generate frequency domain spurs that can extend across an entire receiver band of interest.

Traditionally, these spur frequencies have been managed by adjusting the clock frequencies so that harmonics of the switching frequencies do not fall on top of the desired signal. For terrestrial TV tuners, the clock frequency can be adapted by up to +/−4%. A drawback of this approach is that digital signal processing (DSP) elements such as filters and mixers need to be adjusted due to the change in sampling rate. This raises costs in area and power, and makes dynamic switching of the frequency difficult.

Dynamic switching refers to changing of a clock frequency at which the receiver operates on-the-fly, while a TV channel processed by a first tuner is being watched. Such change is needed in a multi-tuner scenario when a second tuner's desired channel is impaired by the first tuner's clock harmonics. The difficulty of dynamic switching occurs because the digital datapath has latency. As such, a large number of data samples exist in the datapath at a previous sample rate which, when processed at a new sample rate, causes frequency warping of the signal that can result in visible artifacts.

SUMMARY OF THE INVENTION

In a first aspect, an apparatus includes a first analog-to-digital converter (ADC) to receive and sample an analog signal responsive to a first clock signal at a first clock frequency to output digitized samples, where the first clock frequency is dynamically controllable. The apparatus further includes a first asynchronous sample rate converter coupled to the first ADC to receive the digitized samples at the first clock frequency and to output the digitized samples at a second clock frequency, where the second clock frequency is a fixed frequency. In turn, a digital datapath is coupled to the first asynchronous sample rate converter, and includes a plurality of modules to process the digitized samples and to output processed digitized samples, where the digital datapath is to operate according to a second clock signal at the second clock frequency. And, a second asynchronous sample rate converter is coupled to the digital datapath to receive the processed digitized samples at the second clock frequency and to output the processed digitized samples at the first clock frequency.

In some embodiments, a microcontroller is configured to dynamically control the first clock frequency to adjust from an initial clock frequency to an adjusted clock frequency responsive to initiation of a second tuner. In an embodiment, the microcontroller is to dynamically adjust the first clock frequency while the apparatus outputs processed data to a user.

A frequency step controller may be coupled to receive an indication of the adjusted clock frequency from the microcontroller and to generate and send a ratio control signal to the first and second asynchronous sample rate converters to control rate conversion therein. In an embodiment, the frequency step controller is to dynamically adjust the ratio control signal to synchronize a change of the ratio control signal with a control change to a phase lock loop that generates the first clock signal to cause the phase lock loop to generate the first clock signal at the adjusted clock frequency. In addition, the frequency step controller may sequence the adjustment to the ratio control signal with a plurality of steps each corresponding to a step change between the initial clock frequency and the adjusted clock frequency.

In an embodiment, the first asynchronous sample rate converter includes: a first accumulator to receive the ratio control signal and a delayed ratio control value and to output an overflow signal when the first accumulator overflows; and a first filter to receive the digitized samples at the first clock frequency and to output the digitized samples at the second clock frequency responsive to the overflow signal. The first asynchronous sample rate converter may be configured to output an enable signal to a first module of the plurality of modules, and the first module is to be clocked based on the enable signal and the second clock signal, and to thereafter propagate the enable signal to another module.

According to another aspect, an apparatus, which may have a plurality of receivers integrated in a single semiconductor die, includes a first receiver path including a first digitizer to digitize an incoming signal obtained from a RF signal including at least a first desired channel into samples, the first digitizer to operate at a first sampling frequency, a first sample rate converter coupled to an output of the first digitizer to receive the samples at the first sampling frequency and to output the samples at a fixed sampling frequency, and a first digital processor to receive and process the samples at the fixed sampling frequency. The apparatus may further include a controller to receive a frequency change indication and to dynamically control the first sample rate converter to accommodate a change in the first sampling frequency from a first rate to a second rate.

The apparatus may further include a second sample rate converter to receive the processed samples from the first digital processor at the fixed sampling frequency and to output the processed samples at the first sampling frequency. The controller may issue a plurality of ratio control signals to the first sample rate converter during the change of the first sampling frequency from the first rate to the second rate. These ratio control signals cause the first sample rate converter to mimic changes in a phase lock loop that generates a clock signal at the first sampling frequency.

The apparatus may further include a microcontroller to generate the frequency change indication responsive to initiation of a second receiver path to receive a second desired channel. In one example, the first receiver path is of a first receiver, and a second receiver comprises the second receiver path including a second digitizer to digitize a second incoming signal obtained from the RF signal into second samples, the second digitizer to operate at a second sampling frequency, a third sample rate converter coupled to an output of the second digitizer to receive the second samples at the second sampling frequency and to output the second samples at a second fixed sampling frequency, and a second digital processor to receive and process the second samples at the second fixed sampling frequency.

Note that the first digital processor may include one or more filters each having a single set of coefficients to enable operation at the fixed sampling frequency.

According to another aspect, a method includes: receiving, in a controller of a multi-tuner system, a request for a second desired channel while a first tuner of the multi-tuner system is processing a first desired channel; determining whether a first clock signal operating at a first rate and used in the first tuner for processing the first desired channel may cause interference with a frequency of the second desired channel; and if so, dynamically controlling the first clock signal to operate at a second rate, where the first tuner includes a digital datapath that operates according to a second clock signal at a fixed rate that is not dynamically changed.

The method may further include sending, from the controller to a second controller, a frequency change indication to enable the second controller to update a ratio control signal communicated to first and second sample rate converters of the first tuner, the first sample rate converter to receive samples of the first desired channel according to the first clock signal and to output the samples to the digital datapath according to the second clock signal.

The method may further include dynamically adjusting, in the second controller, the ratio control signal to synchronize a change of this ratio control signal with a control change to a phase lock loop that generates the first clock signal, the control change to cause the phase lock loop to generate the first clock signal at the second rate.

The method may further include sequencing, in the second controller, the dynamic adjustment to the ratio control signal with a plurality of steps each corresponding to a step change between the first rate and the second rate.

In an embodiment, the method includes outputting an enable signal to a first module of the digital datapath, and clocking the first module based on the enable signal and the second clock signal, and thereafter propagating the enable signal to a second module of the digital datapath coupled to an output of the first module.

DETAILED DESCRIPTION

In various embodiments a frequency management system employs a pair of arbitrary rate sample rate converters (SRCs) to alleviate distortion caused by switching sampling rates in a mixed signal device such as a RF receiver (e.g., a TV receiver). The first SRC is placed at the start of a digital datapath and is configured to convert samples received at a variable rate from a digitizer such as an analog-to-digital converter (ADC) to a fixed, virtual rate. Note that this fixed rate is an average fixed rate that is obtained from selecting cycles at the variable rate, while certain other cycles at the variable rate are inactive or dropped. Subsequent digital processing is done at the virtual rate or at fixed multiples or divisions of the virtual rate. Following the digital datapath, just before a digital-to-analog converter (DAC), the second SRC is used to convert samples from the virtual rate, or a fixed multiple or division of the virtual rate, to the variable DAC sample rate. A control unit is used to coordinate the changes to a phase lock loop (PLL) sample rate and SRC conversion ratios.

It can be understood that by using an embodiment, digital elements can be simplified since they no longer need to adapt to a variable sampling rate. In addition, when the sampling rate is switched, the only digital elements to be adjusted are the SRCs. The SRCs can be designed with extremely low latency, which may drastically reduce frequency warping effects. In addition, arbitrary rate SRCs allow for the possibility of following the sample rate switching transients of the PLL, further reducing the effects of the switching.

Figure 1:
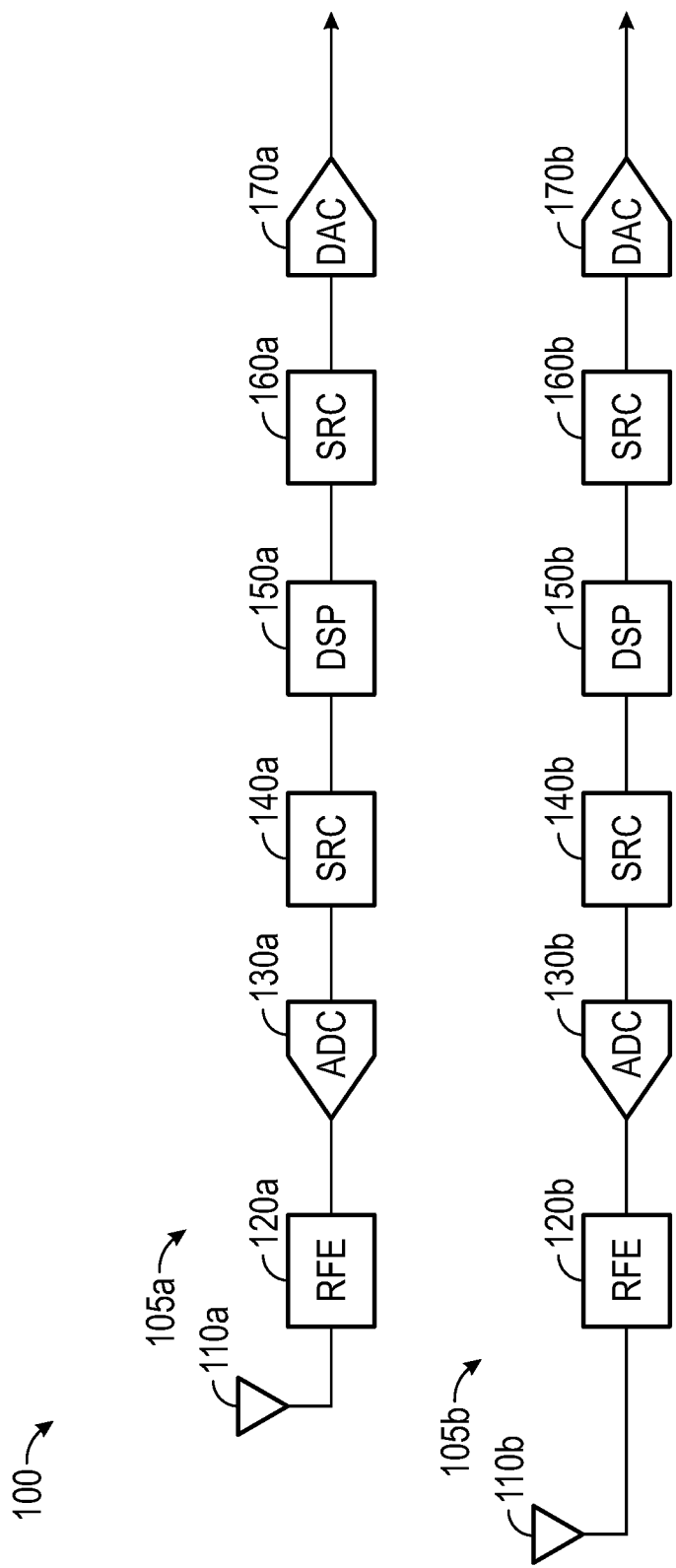
FIG. 1 is a block diagram of a portion of a system in accordance with an embodiment.

Referring now to FIG. 1, shown is a block diagram of a portion of a system in accordance with an embodiment. System 100 may be a part of a television receiver that receives a source of incoming RF signals, and downconverts and processes the same to obtain desired content such as video data for playback on a television or other playback device. The receiver may generally include a tuner and a demodulator, which can be implemented as a single chip integrated circuit (IC) formed on a single semiconductor die, implemented as a multi-chip module, or multiple separate ICs (or die) may be present. More particularly, embodiments may be used in a multi-tuner system that is capable of concurrently receiving and processing multiple RF channels.

System 100 incorporates an embodiment of the spur management techniques described herein in which multiple asynchronous sample rate converters are provided to enable fixed frequency processing in digital logic, even when spur management techniques are applied to dynamically modify clock frequencies of other portions of the receiver due to potential interference with other desired channels.

As seen in FIG. 1, two parallel receiver paths 105a and 105b are present. For ease of discussion, the components of receiver path 105a are further discussed (for generalization between components of the two paths, the sub-identifiers "a" and "b" are not used herein), as similar components may be present in second path 105b. Of course it is also possible for the different receivers to be somewhat heterogeneous in their design, particularly where the receivers are configured to process different types of input signals. In the embodiment of FIG. 1, incoming RF signals are received by an antenna 110 configured for receiving over the air signals such as broadcast or satellite signals. However in other implementations, rather than a direct connection to an antenna, system 100 may be configured to receive incoming RF signals via a cable or other input means.

The incoming signals are provided to a receiver front end 120, which is an analog front end circuit of the receiver that performs various processing on the signals such as gain control, filtering and so forth, and further downconverts the incoming RF signals to a lower frequency, e.g., a given intermediate frequency (IF), zero IF, or baseband signal. For purposes of discussion, assume that the signals output by receiver front end 120 are at a low IF frequency. Thereafter signals are digitized in an analog-to-digital converter (ADC) 130. Note that this conversion occurs according to a sampling rate controlled by a microcontroller (not shown for ease of illustration in FIG. 1).

Given the presence of the 2 tuners, it is possible for both tuners to be active at the same time and further it is possible that the clock frequency used for processing signals in one tuner may conflict with a frequency of the desired channel of the other tuner. More specifically, it is possible that a harmonic of the clock frequency used by components in the first tuner may fall into a frequency band of a desired channel to be processed by the second tuner. Accordingly, various components in the first tuner can be operated with a dynamically controllable variable clock frequency to avoid this potential source of interference. More specifically, the ADC and other components may have their operating frequency adjusted. However, note that the majority of the digital processing may occur according to an average fixed frequency, referred to herein as a virtual frequency (and the average fixed frequency is equally referred to herein as a fixed frequency). Note that this virtual frequency exists as an average. That is, at any given time clock signals exist at the ADC frequency, such that there is no direct generation of spurs at the virtual frequency.

After digitization in ADC 130, the digitized samples are provided to a SRC 140. In various embodiments, this SRC may be an asynchronous or arbitrary sample rate converter that receives incoming digitized samples at an arbitrary frequency (e.g., under microcontroller control) and outputs the samples according to a fixed frequency, namely the virtual frequency at which a DSP 150 operates. Further details regarding SRC 140 are discussed below.

In general, DSP 150 includes logic that may be implemented as a datapath including a plurality of modules to perform processing on the digitized samples. This processing includes various filtering, decoding, demodulation and so forth to thus generate demodulated samples that are provided to another sample rate converter 160, which in an embodiment is another asynchronous sample rate converter to take incoming samples at a fixed frequency, namely the virtual frequency, or a fixed multiple or division thereof, and to output the samples at an arbitrary frequency, e.g., under microcontroller control. After such sample rate conversion in SRC 160, the resulting samples are provided to a DAC 170 for conversion back to analog form so that they can be provided to an appropriate consumer such as a display or so forth.

Given that DSP 150 operates at a fixed frequency, its design constraints may be relaxed. That is, by way of a single static frequency for controlling the digital datapath, the need for multiple sets of coefficients for filters and other digital datapath modules can be avoided, reducing real estate consumption of such coefficients or other table information in storage and further reducing complexity in the datapath. Stated another way, each filter (or other modules) may have only a single set of coefficients to enable operation at the single fixed virtual frequency. Although shown at this high level in the embodiment of FIG. 1, understand that variations are possible and further details are not shown so as to not obscure this high level discussion.

For example, while the SRC's are shown at particular positions in the receiver path in FIG. 1, understand these SRC's may be moved to different locations in other implementations. For example, the front end SRC may be implemented at different points within a decimation chain. And furthermore, the backend SRC may be implemented at various points within an interpolation chain. Also note that given a preferred location of these SRC's at an output of the ADC and at an input to the DAC, respectively, relatively simple spline filters may be used for the SRC's. For example, in an embodiment a second-order spline function may be used with a limited number of simple coefficients for the SRC at the output of the ADC. Similarly, a third-order spline filter may be used for the SRC at the input to the DAC, that also has a limited number of relatively simple coefficients.

Embodiments thus enable dynamic clock frequency changes to an operating frequency of at least one tuner when another tuner becomes active so that spurs of the clock frequency of the first tuner do not interfere with a desired channel to be processed in the second tuner. This dynamic frequency management can be performed at different times within processing depending on the type of signals being processed. For example, when the first tuner is processing an ATV channel, switching from a first clock frequency to a second clock frequency may occur during a vertical blanking interval to avoid visible artifacts. Instead when the first tuner is operating in a DTV mode, small frequency steps are used to adjust the frequency to a modified value. Furthermore, this adjustment may be performed in a manner to reduce or prevent uncorrectable errors such as visible artifacts or other issues.

By providing an architecture such as shown in FIG. 1 with multiple sample rate converters connected in series at a front end and a back end of a digital datapath, this digital datapath is allowed to maintain a constant sampling rate while the components on either side of the sample rate converters may have clock frequencies that change dynamically. In an embodiment, gapped clock/data techniques may be used to implement a fixed virtual sampling rate.

For purposes of discussion, assume that circuitry outside of the sample rate converters, e.g., an ADC coupled to an input of a first sample rate converter and a DAC coupled to an output of a second sample rate converter, operate at a clock frequency of up to 244 MHz (and which is variably controlled depending on the potential for noise). Instead, a digital datapath coupled between the 2 sample rate converters may be controlled to operate at a fixed virtual clock frequency of 219 MHz. By using these successive serial sample rate converters at an input and output of the digital datapath, dynamic changes can be effected. Note that as discussed above when changing from a first clock frequency to a second clock frequency, small step changes to the SRC's may occur to effect the frequency change. To minimize transient switching effects, these small step changes may be performed in a manner to replicate or match phase lock loop (PLL) transient settling behavior. Further by providing a fixed sample rate to the digital datapath, datapath latency effects may be eliminated. Note that such transients or latency effects occur as the digital datapath has non-zero latency (namely has state memory), while in contrast a PLL cannot change instantaneously from the first frequency to the second frequency.

By providing a fixed virtual frequency for the digital datapath, samples contained within the datapath at a first sample rate are not impacted during a transition to a second sample rate. That is, a digital datapath may hold some amount of data, e.g., approximately 10 µs of data. Without the techniques described herein, this data at a first sample rate is processed at an incorrect sampling rate when a frequency change occurs. As a result, the sample rate change causes a frequency shift in the signal which can allow frequency glitches to occur.

Note that the sample rate converters may be implemented in different manners in various embodiments. For purposes of illustrating a representative sample rate converter, a Farrow structure may be used as a sample rate converter. In general, such a structure includes a plurality of delay elements and coefficients that are used to calculate impulse response segments using piecewise polynomials with coefficients and variable delay. Furthermore, using such a structure, anti-imaging or anti-aliasing may be realized. In an embodiment, a front end sample rate converter may be implemented using a transposed Farrow structure that provides anti-aliasing while a back end sample rate converter may be implemented using a Farrow structure that provides a measure of anti-imaging. Understand that various implementations of such Farrow structures may be used in different embodiments.

Figure 2:
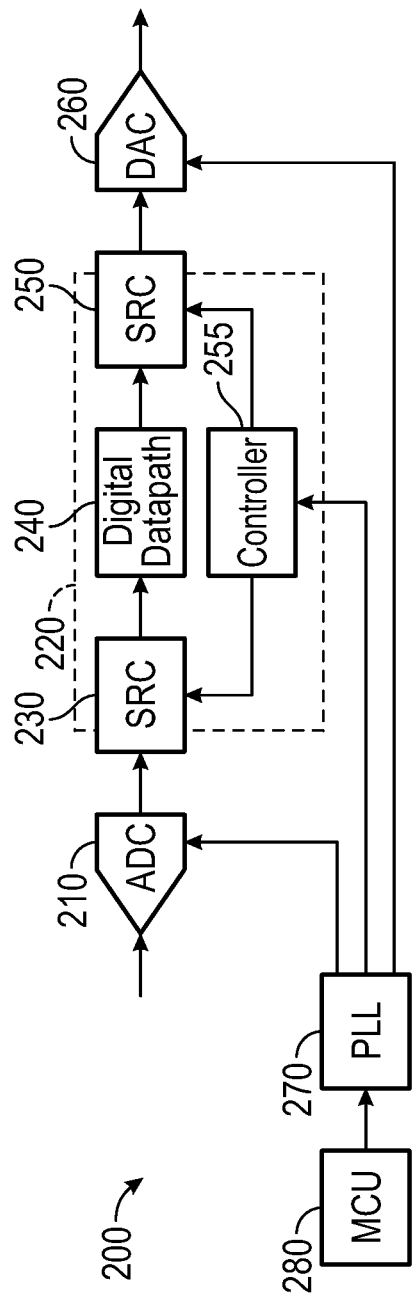
FIG. 2 is a block diagram of further details of a portion of a receiver path in accordance with an embodiment.

Referring now to FIG. 2, shown is a block diagram of further details of a portion of a receiver path in accordance with an embodiment. As shown in FIG. 2, a portion of a receiver 200 is illustrated primarily corresponding to a digital portion of the receiver coupled between an ADC 210 and a DAC 260. As seen, both ADC 210 and DAC 260 have sampling rates controlled by clock signals received from a PLL 270. In turn, the operating clock frequency generated by PLL 270 is under control of a microcontroller unit (MCU) 280 such as a given microcontroller, which may be implemented on-chip.

As further illustrated in FIG. 2, a virtual clock frequency domain 220 is present that includes at least portions of the front end sample rate converter 230 and a back end sample rate converter 250, along with a digital datapath 240 that operates at a fixed frequency corresponding to the virtual frequency. To enable the datapath to operate at this fixed frequency while ADC 210 and DAC 260 operate at dynamically controllable frequencies, a frequency step controller 255 is provided and is interposed between PLL 270 and the corresponding sample rate converters 230 and 250. As will be described further herein, controller 255, which in an embodiment may be a finite state machine (FSM), operates to provide a controllable ratio signal to the sample rate converters to enable them to operate to receive incoming data at a first sample rate and to output data at a second sample rate. Understand also that while shown with all of these components in the example of FIG. 2, certain of the components can be bypassed when dynamic clock frequency updates do not occur as described herein. That is, in the case of a single tuner system, or when a multi-tuner system is only accessing content using a single tuner, the dynamic frequency management described herein is not needed and accordingly in some implementations complexity and power consumption can be reduced by bypassing sample rate converters within a receiver path, as well as powering down certain control elements, including controller 255.

Figure 3:
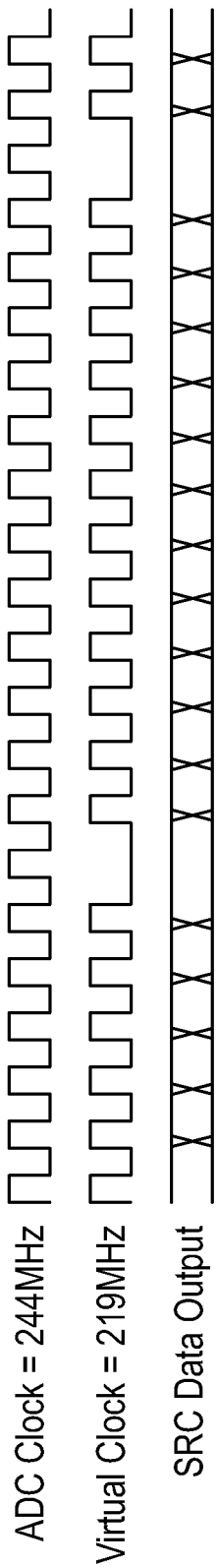
FIG. 3 is a timing diagram illustrating sample rate conversion in accordance with an embodiment.

Referring now to FIG. 3, shown is a timing diagram illustrating sample rate conversion in accordance with an embodiment. In the example shown, assume that a front end ADC (e.g. ADC 210 of FIG. 2) is operating at a sampling rate of 244 MHz. In turn, assume that a static or fixed clock frequency for the digital domain is a virtual clock operating at 219 MHz. To enable a rate conversion to occur within a SRC (e.g., SRC 230 of FIG. 2), data may be received in SRC 230 at the ADC sampling rate and output at the virtual clock rate by skipping or dropping certain clock signals of the virtual clock such that a clock enable does not toggle in these skipped clock cycles. Accordingly, the SRC provides a data output that actively toggles for each cycle of the virtual clock.

Figure 4:
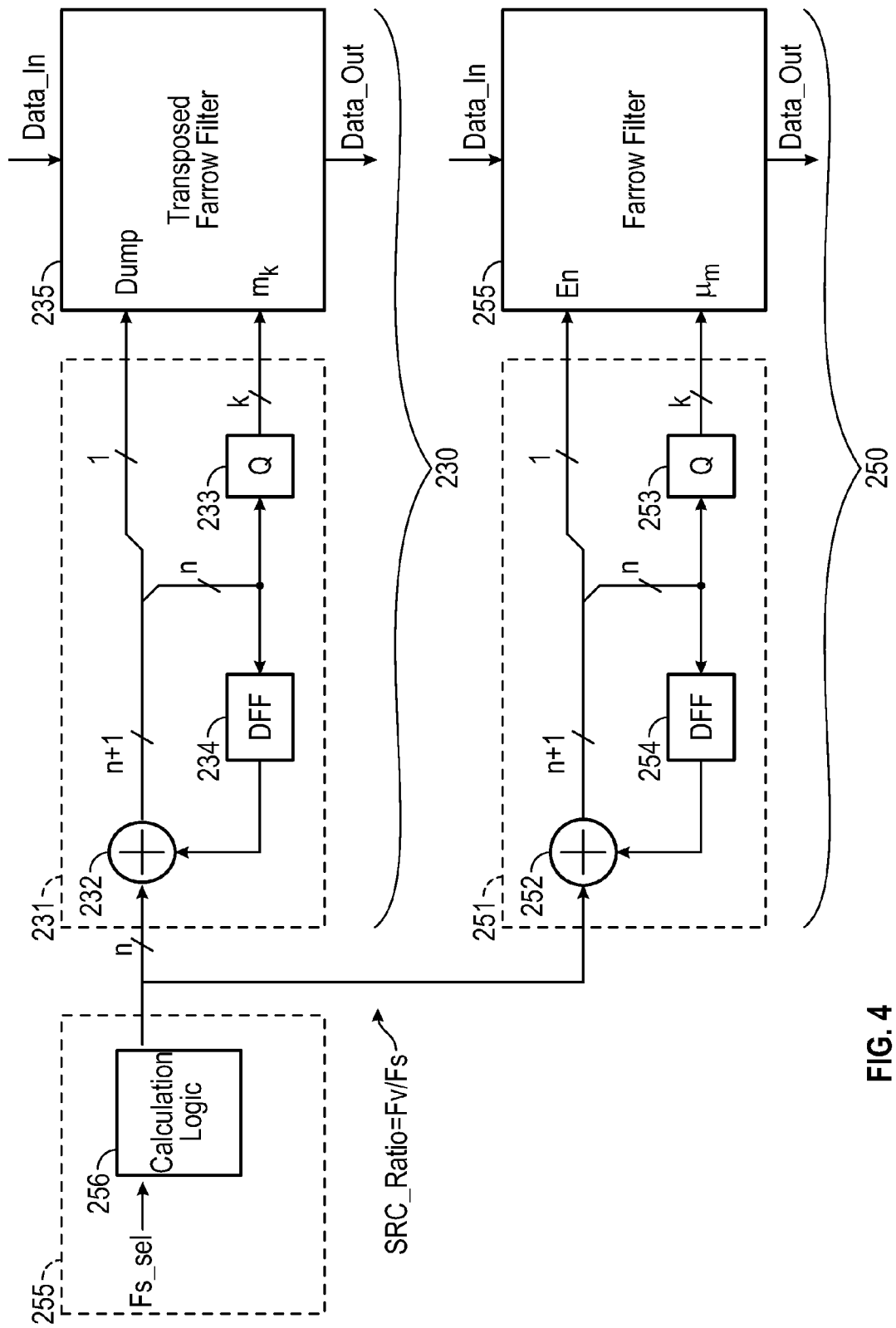
FIG. 4 is a sample rate conversion architecture in accordance with an embodiment.

Referring now to FIG. 4, shown are further details of a sample rate conversion architecture in accordance with an embodiment. As shown in FIG. 4, controller 255, which in an embodiment may be a frequency step controller implemented as a FSM, receives a control signal, e.g., from an MCU, to determine a sampling frequency. Based on this signal, controller 255 determines a ratio for sample rate conversion. In an embodiment, a calculation logic 256 may perform a calculation to determine the sample rate conversion ratio, e.g., with reference to a lookup table. In an embodiment, this value equals a ratio between a virtual frequency (namely a static frequency (Fv)) and a sampling frequency (Fs) which corresponds to a requested sampling frequency for the ADC and DAC, e.g., responsive to a dynamic frequency management operation when a second tuner comes online and potentially may be interfered with by a spur caused by a harmonic of the clock signal frequency previously used by these components.

Thus controller 255 outputs this sample rate conversion ratio, which in an embodiment may be configurable to be between 8 and 16 bits. A system may be configured for a given width, or the width may be dynamically controlled, e.g., based on a demodulator sensitivity. This ratio control signal is provided to the 2 sample rate converters 230 and 250. As seen, each of these sample rate converters includes a calculation structure 231/251 and a corresponding Farrow filter 235/255. Structure 231 operates as an overflowing accumulator with regard to this sampling rate ratio such that an overflow signal indicates a clock period when a new SRC output is not generated (in other words, a gap is created). In turn, calculation structure 251 also operates as using an overflowing accumulator such that an overflow signal indicates a clock period when the SRC output is to create (or interpolate) an extra output from the current input samples (in other words, a gap is removed).

In an embodiment, a fraction of a sample may be calculated as a function of the ratio between the actual sampling rate Fs and the virtual sampling rate Fv according to:

$$\mu_i = \text{frac}(i \times fv/fs), \text{ where } 0 \leq \mu_i \leq 1.$$

Specifically, calculation structure 231 (generically) may be used to determine a fractional value $\mu_i$ that corresponds to a fraction of a product between the sample rate conversion ratio and an integer value i, which corresponds to the index of samples at the ADC/DAC sample rate. With reference to calculation structure 231, shown is an accumulator 232 that sums the input ratio with a delayed ratio value obtained from a delay element 234 which in an embodiment may be implemented with D-type flip-flops. When the most significant bit is high, a dump signal is communicated to transposed Farrow filter 235 to indicate the time when no new output is generated. Note further that the output of accumulator 232 is coupled to a quantizer 233 that quantizes these n bits into k bits corresponding to $\mu_i$, which is also provided to transposed Farrow filter 235 to specify the fractional sample delay. Both SRCs may use the same ratio, but if operating at different rates, the sequence may be different. In some embodiments, a single calculation circuit may be used for both SRCs.

Thus in an embodiment, the SRC ratio corresponds to the ratio between the ADC/DAC sample rate and the sample rate of the virtual frequency. In an embodiment, a relatively large plurality of frequency steps may occur during dynamic frequency changes (at least in DTV modes). For example, an initial sample rate for the ADC/DAC may be approximately 220 MHz, while the virtual rate remains fixed at 219 MHz. In turn, a microcontroller may instruct the ADC/DAC sample rate to be changed to a value of 244 MHz. This change may take effect over time, using multiple smaller steps in frequency. In one particular embodiment, a frequency change from 220 MHz to 244 MHz may occur in 1/14 MHz steps. Note that the actual number of steps may vary in different implementations.

Furthermore, different manners of determining the multiple SRC ratio values during this frequency transition may exist. For example, these values may be computed in one embodiment, and obtained from a table storage such as a lookup table implemented in a read only memory in another embodiment. In various embodiments, a frequency step controller may be under firmware control to implement a dynamic frequency change from an original clock frequency to a new clock frequency according to a programmable step size, a programmable time between steps, and other parameters to mimic a frequency change occurring within the PLL. Such mirroring or mimicking of this frequency change may be according to step, ramp, or exponential settling, as examples.

Stated another way, the SRCs provided herein including a Farrow (or transposed Farrow) structure implement a single delay parameter defined by μ. This sample delay may be calculated on a sample-by-sample basis as a fractional remainder of accumulation of the relative timing fraction of the converted side to the unconverted side. By controlling the transition of this relative timing fraction from the first conversion rate to the second conversion rate, the SRC ratio can be controlled. In this way, the PLL sample rate transition may be mirrored to cancel transients associated with sample rate conversion changes. In addition, embodiments may provide for amplitude compensation to compensate for frequency-dependent gain of the interpolator. This may be so since amplitude varies with sample rate variations.

Figure 5:
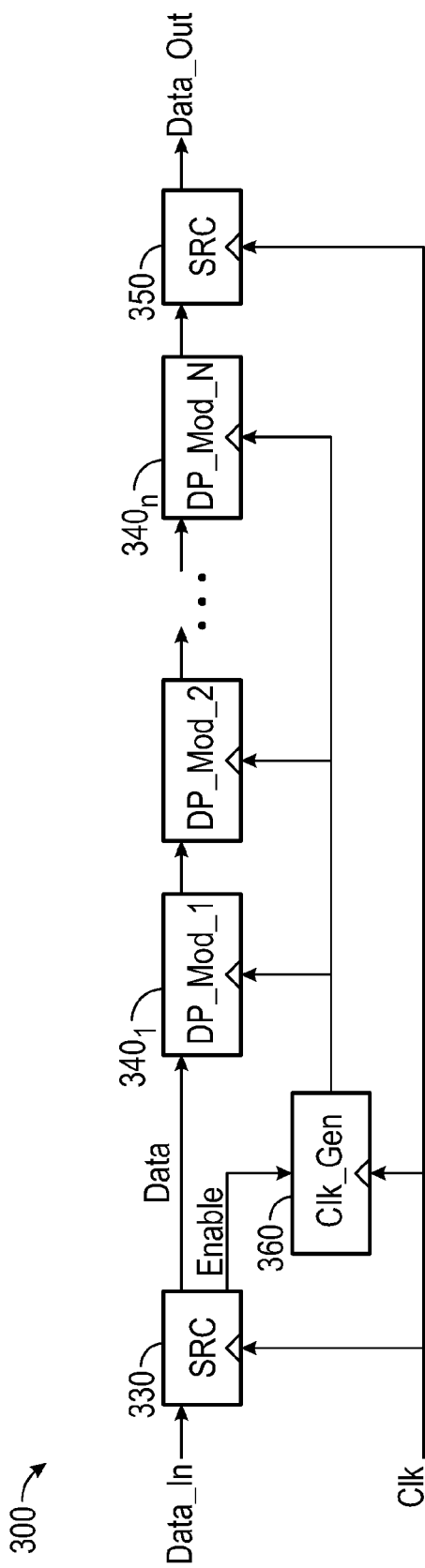
FIG. 5 is a block diagram of a portion of a datapath clocked in accordance with a lockstep clocking method.

In different implementations, a variety of clocking methods may be used for the digital datapath coupled between the sample rate converters. For example, in different embodiments a lockstep clocking method or a propagated clocking method may be used. Referring now to FIG. 5, shown is a block diagram of a portion of a datapath clocked in accordance with a lockstep clocking method. As seen in FIG. 5, a portion of a receiver 300 includes a datapath in which incoming data is provided to a front end sample rate converter 330 and thereafter to a digital datapath formed of a plurality of datapath modules $340_1$-$340_n$. Although different variations are possible, as one example approximately 20 such datapath modules may be provided, each of which is to perform a particular digital function such as channelization, filtering, digital processing and so forth. In the lockstep approach shown in FIG. 5, each module is clocked/not clocked at the same time by a clock signal generated by a clock generator 360 that in turn is clocked by an incoming clock signal upon an enable signal generated by SRC 330. Thus when the SRC 330 provides valid data out, a corresponding enable signal is provided to allow the datapath to be clocked in lockstep such that the incoming clock signal is globally gated at a source and all datapath modules are clocked/not clocked at the same time.

Figure 6:
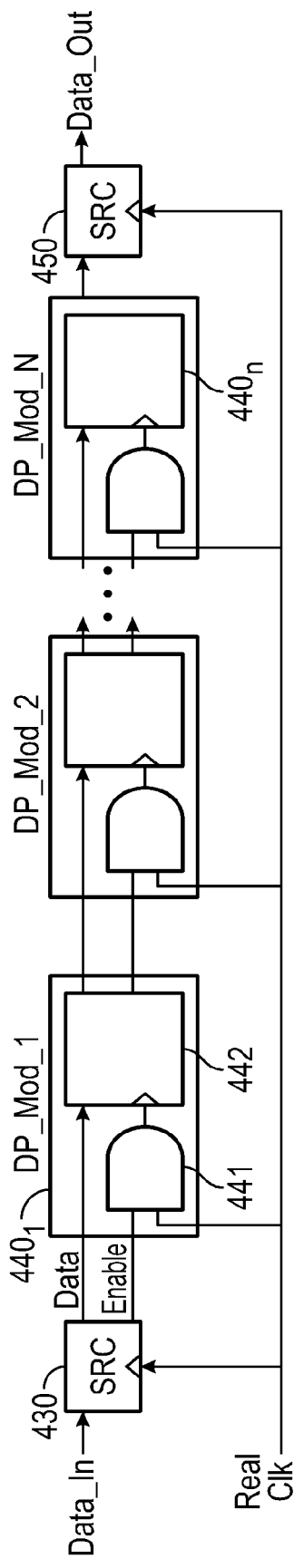
FIG. 6 is a block diagram of a portion of a datapath clocked in accordance with a propagated clocking method.

In contrast, with reference to FIG. 6, shown is a block diagram of a portion of a datapath clocked in accordance with a propagated clocking method. In this implementation an enable signal may be propagated along the datapath such that each datapath module is locally gated to allow data to be processed. Thus as seen in FIG. 6, a portion of a receiver 400 similarly includes a sample rate converter 430 at a front end to receive data. In this case, the sample rate converter provides both output data and an enable signal to a first datapath module $440_1$ that further is coupled to receive a global clock signal at a logic gate 441, which further receives the enable signal such that when both are valid, a clock signal to clock a functional unit 442 is active. In this way, an enable signal propagates along the datapath and locally gates clocks. Using a propagated clock method, performance may be enhanced over a lockstep method as a relative level of peak spurs may be reduced, since all digital datapath modules are clocked at the same time in a lockstep method.

Figure 7:
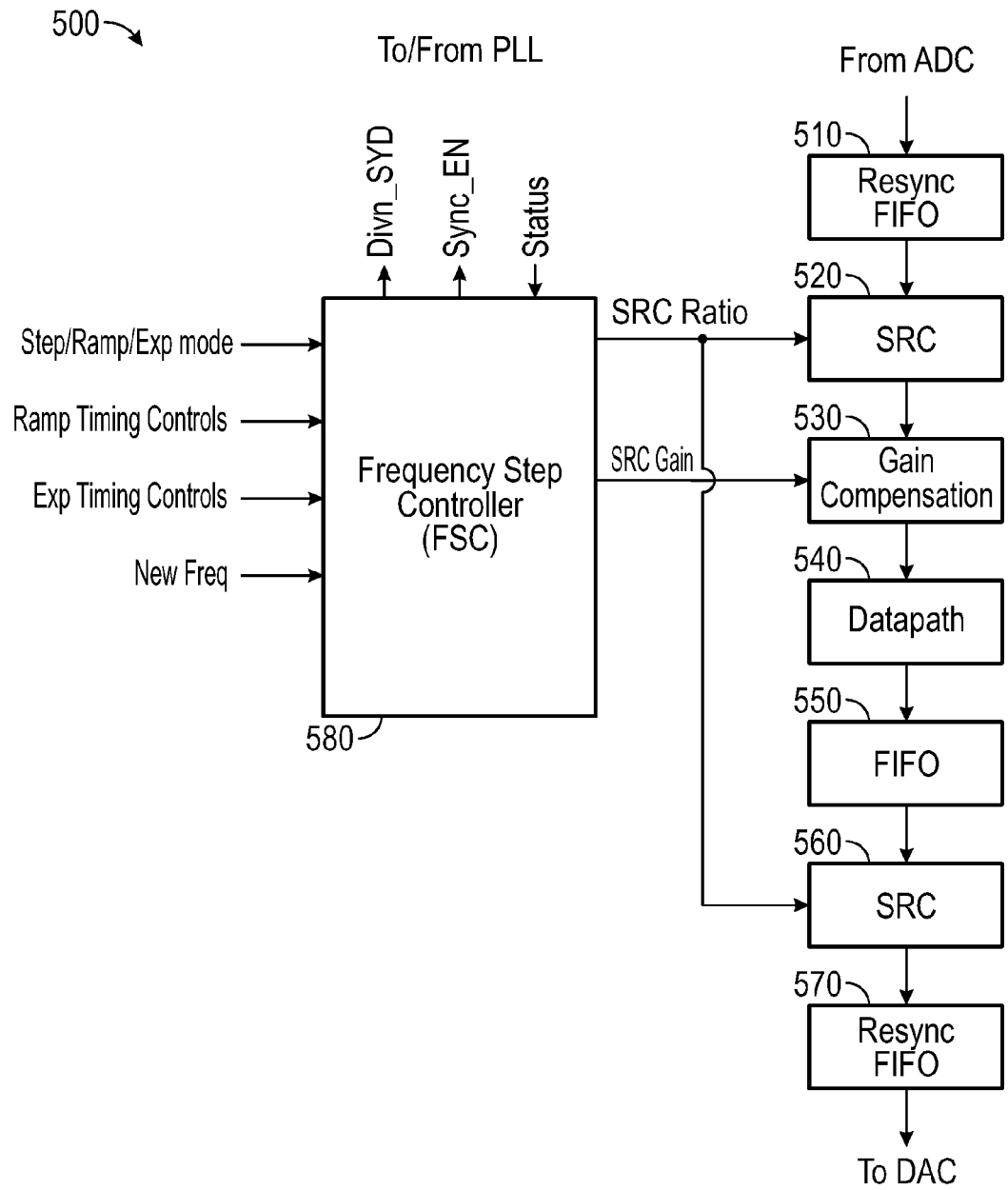
FIG. 7 is a block diagram of an example dynamic frequency management system.

Referring now to FIG. 7, shown is a block diagram of an example dynamic frequency management system. As shown in FIG. 7, system 500 may be implemented using a frequency step controller 580 that receives incoming instructions, e.g., from a microcontroller that executes firmware of a device. More specifically, in conditions in which interference is possible, a dynamic frequency control command may be received, along with an indication of an appropriate adjusted frequency at which the components of the receiver path may be set.

Also shown in FIG. 7 is a portion of a receiver path. More specifically, a datapath from an output of an ADC to an input of a DAC is shown in some detail. As seen, incoming digitized information from the ADC may be provided to a resynchronization first in first out (FIFO) buffer 510 that in turn is coupled to an SRC 520 that has its sample rate controlled responsive to a sample rate conversion ratio signal received from controller 580. After sample rate conversion here, the digitized samples are provided to a gain compensation module 530. As described herein, due to sample rate changes, a gain compensation may be performed in module 530 under control of a gain control signal received from controller 580.

Thereafter these gain compensated signals are provided to a digital datapath 540 which may include a plurality of modules to perform various digital processing operations. This datapath length may vary and in some embodiments may be between approximately 20-30 modules long, each of which may consume one or more clock cycles. Thereafter, the processed samples are provided to a FIFO 550, which may absorb samples during asynchronous rate changes, and on to another SRC 560, which again may be controlled by a ratio control signal generated by controller 580. Finally, the adjusted samples may be coupled through a resynchronization FIFO 570 and thereafter to a DAC for conversion back to analog signals and then provided to an appropriate consuming device, e.g., a television or other display.

With reference to frequency step controller 580, various incoming control signals are received from the microcontroller. The signals may include a mode signal that indicates whether the dynamic frequency change that is occurring within a PLL (not shown in FIG. 7) is in accordance with a step, ramp or exponential type of change. Using this mode signal, frequency step controller 580 may generate the SRC ratio signal in like manner to thus mimic the type of frequency change that occurs so that transients may be reduced. In addition, various control signals for timing of such ramping or exponential changes may also be provided. Still further, a control signal may be received from the microcontroller to indicate the new frequency at which the SRC's are to operate. Of course while shown with these particular datapath details and control signals in the embodiment of FIG. 7, understand that variations are possible.

Controller 580 may thus receive an updated clock frequency, e.g., from a control register for a PLL. Responsive to such sample rate changes, the controller may determine a plurality of small steps to sequence the sample rate change from a first sample rate to a second sample rate in a manner to reduce transients. As discussed above, various methods for determining these small steps may be present in different embodiments, including a calculation method and a lookup table method. In this way, changes to the sample rate conversion ratio may be synchronized with changes to the PLL. Furthermore, these small steps may be sequenced with a programmable step size and delay, and further may interpolate between PLL divider changes to allow an approximation of PLL frequency transitions.

Figure 8:
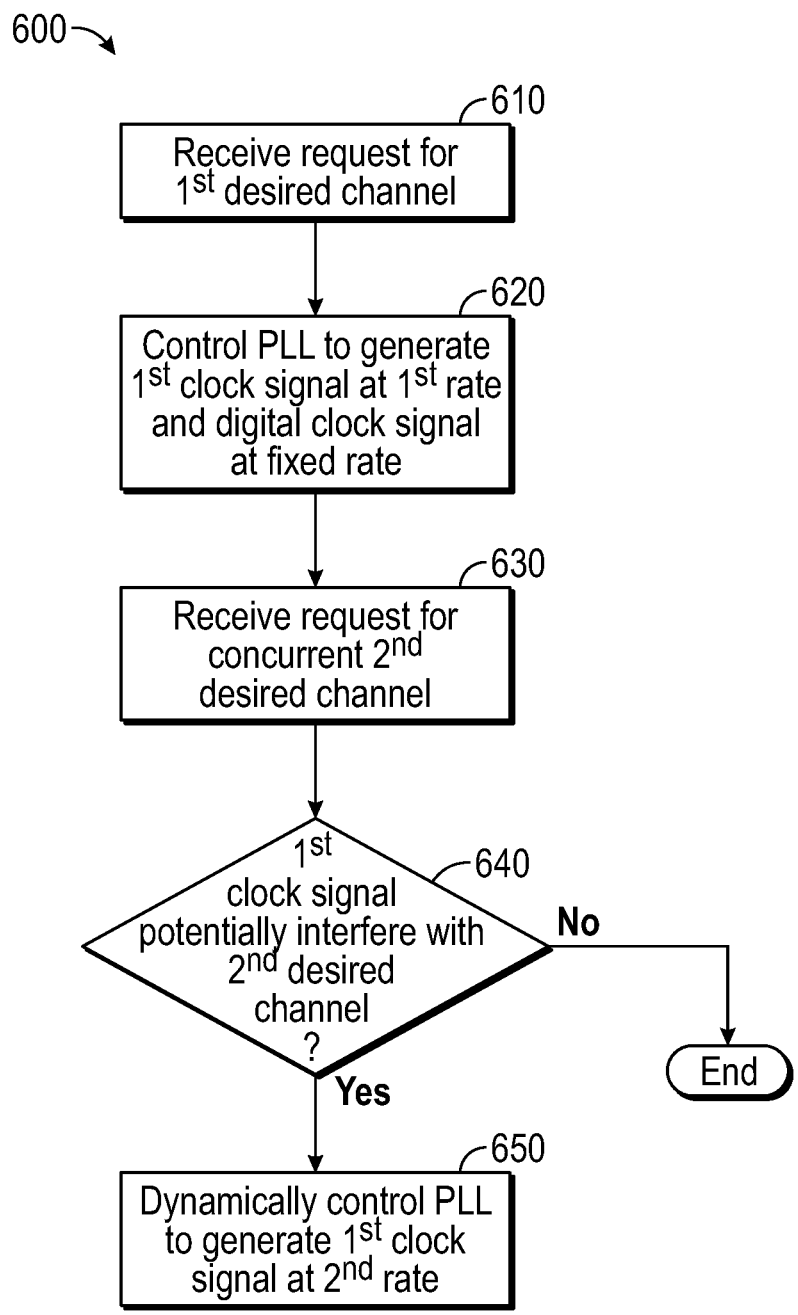
FIG. 8 is a flow diagram of a method in accordance with an embodiment.

Referring now to FIG. 8, shown is a flow diagram of a method in accordance with an embodiment. Specifically, method 600 of FIG. 8 may be used to perform dynamic frequency changes as described herein. In general, method 600 may be performed by a microcontroller or other control logic of a receiver configured to execute firmware. In addition to original frequency determinations, the microcontroller may also perform dynamic frequency management in the condition of a request for a second channel being made, where the second channel is at a frequency that is potentially interfered with by one or more clock signals used in processing a first channel being concurrently processed in a multi-tuner device.

As seen, method 600 begins by receiving a request for a first desired channel (block 610). As an example, this request may be received in the microcontroller when a user first powers on a TV or other device and seeks to watch a given channel. Based on the frequency of the desired channel, at block 620 a PLL is controlled to generate a first clock signal at a first rate and a digital clock signal at a fixed rate. Specifically, the first clock signal may be used as a sampling clock for both an ADC and DAC of a path of a first receiver. In turn, the digital clock signal may be at the virtual frequency described herein to enable the DSP to operate at a fixed rate, such that the complexities involved in performing frequency changes for the digital datapath are avoided.

Thus at this point, the first receiver is configured to normally operate to process incoming signals using the first clock signal at a given rate and the digital clock signal to output the desired content. During such operation, assume that the user seeks to also tune to a second channel, e.g., for a picture in picture function, for purposes of a digital video recorder or for another reason, such as output to a different display. Thus at block 630 a request is received for a concurrent second desired channel. Responsive to this request, control passes to diamond 640 where it can be determined whether the first clock signal potentially interferes with the second desired channel. This potential interference may be caused due to a harmonic of the first clock signal introducing noise into the second desired channel. While different manners of performing this determination may occur, in an embodiment the determination may be made with reference to a table that identifies a frequency corresponding to the first rate and an indication of one or more frequencies with which this clock signal frequency may interfere. For example, in an embodiment a table may include entries, where each entry is associated with a given variable clock signal frequency (used for the ADC/DAC) and values for RF channels with which this clock signal may cause interference. If no such interference is determined, no dynamic clock management is needed and accordingly, no further actions are taken in the method. Instead, the first clock signal may continue to be generated at the first rate and, either in the same PLL or in a different PLL, another clock signal may be generated for use by a second receiver path that is processing signals of the second desired channel (and the PLL may also generate a digital clock signal at the same virtual frequency).

Instead in the case where potential interference is determined at diamond 640, control passes to block 650 where the PLL may be dynamically controlled to generate the first clock signal at a second rate. Note that this second rate may be at a higher or lower frequency. In any event, this frequency is selected such that harmonics of the first clock signal do not interfere with this second desired channel. Accordingly, a control signal can be sent to the PLL to cause this frequency change. In addition, the controller may also send a control signal or other frequency change indication to another controller, such as the frequency step controller described above, to enable a dynamic change to occur for controlling of the multiple sample rate converters. Although shown at this high level in the embodiment of FIG. 8, understand that alternatives are possible.

Figure 9:
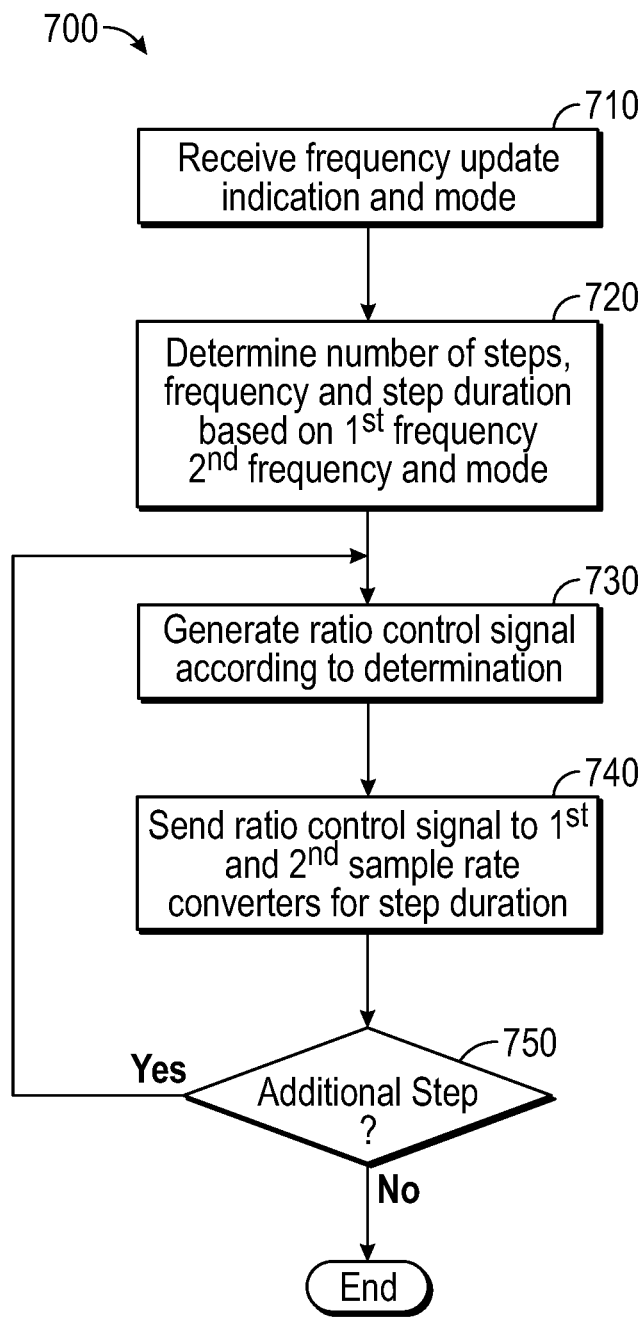
FIG. 9 is a flow diagram of a method in accordance with another embodiment.

Referring now to FIG. 9, shown is a flow diagram of a method in accordance with another embodiment. More specifically method 700 of FIG. 9 may be performed using a frequency step controller to perform dynamic sequencing of ratio control signals sent to the sample rate converters during a dynamic frequency change from a first sample frequency to a second sample frequency used by front end and back end ADC/DACs.

As seen in FIG. 9, method 700 begins by receiving a frequency update indication and mode (block 710). In an embodiment, this indication may be a signal received in the frequency step controller from a microcontroller to indicate that a dynamic frequency change is to occur such that the sampling frequency for the ADC/DAC is to be changed from a first sample frequency to a second sample frequency. In turn, the mode signal indicates a mode in which the PLL is to dynamically switch frequencies, e.g., according to a ramp mode, exponential mode or other type of mode. From this information, at block 720 the frequency step controller can determine a number of steps, step frequency and step duration. In part, this determination may be based on the original sampling frequency, the adjusted sampling frequency and the mode.

Next at block 730 the frequency step controller generates a ratio control signal according to this determination and at block 740 sends this ratio control signal to the sample rate converters for a duration of the step. Next at diamond 750 it is determined whether additional steps are to be performed in the dynamic frequency change. If so, control passes back to block 730, otherwise the method concludes. Note that methods 600 and 700, and more generally the dynamic clock management including SRC control described herein may be performed using various hardware, software, and/or firmware in different embodiments. To this end, some embodiments may implement a tangible non-transitory storage medium to store instructions that when executed perform the dynamic clock management techniques described herein.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
    a first analog-to-digital converter (ADC) to receive and sample an analog signal responsive to a first clock signal at a first clock frequency to output digitized samples, wherein the first clock frequency is dynamically controllable;
    a first asynchronous sample rate converter coupled to the first ADC to receive the digitized samples at the first clock frequency and to output the digitized samples at a second clock frequency, wherein the second clock frequency is a fixed frequency;
    a digital datapath coupled to the first asynchronous sample rate converter, and including a plurality of modules to process the digitized samples and to output processed digitized samples, the digital datapath to operate according to a second clock signal at the second clock frequency; and
    a second asynchronous sample rate converter coupled to the digital datapath to receive the processed digitized samples at the second clock frequency and to output the processed digitized samples at the first clock frequency.

2. The apparatus of claim 1, further comprising a microcontroller to dynamically control the first clock frequency to adjust from an initial clock frequency to an adjusted clock frequency responsive to initiation of a second tuner coupled to the apparatus, the apparatus comprising a first tuner.

3. The apparatus of claim 2, further comprising a frequency step controller coupled to receive an indication of the adjusted clock frequency from the microcontroller and to generate and send a ratio control signal to the first asynchronous sample rate converter and the second asynchronous sample rate converter to control rate conversion therein.

4. The apparatus of claim 3, wherein the frequency step controller is to dynamically adjust the ratio control signal to synchronize a change of the ratio control signal with a control change to a phase lock loop that generates the first clock signal to cause the phase lock loop to generate the first clock signal at the adjusted clock frequency.

5. The apparatus of claim 4, wherein the frequency step controller is to sequence the adjustment to the ratio control signal with a plurality of steps each corresponding to a step change between the initial clock frequency and the adjusted clock frequency.

6. The apparatus of claim 3, wherein the first asynchronous sample rate converter comprises:
   a first accumulator to receive the ratio control signal and a delayed ratio control value and to output an overflow signal when the first accumulator overflows; and
   a first filter to receive the digitized samples at the first clock frequency and to output the digitized samples at the second clock frequency responsive to the overflow signal.

7. The apparatus of claim 1, wherein the microcontroller is to dynamically adjust the first clock frequency while the apparatus outputs processed data to a user.

8. The apparatus of claim 1, wherein the first asynchronous sample rate converter is to further output an enable signal to a first module of the plurality of modules, wherein the first module is to be clocked based on the enable signal and the second clock signal, and to thereafter propagate the enable signal to a second module of the plurality of modules.

9. An apparatus comprising:
   a first receiver path including a first digitizer to digitize an incoming signal obtained from a radio frequency (RF) signal including at least a first desired channel into samples, the first digitizer to operate at a first sampling frequency, a first sample rate converter coupled to an output of the first digitizer to receive the samples at the first sampling frequency and to output the samples at a fixed sampling frequency, and a first digital processor to receive and process the samples at the fixed sampling frequency; and
   a controller to receive a frequency change indication and to dynamically control the first sample rate converter to accommodate a change in the first sampling frequency from a first rate to a second rate.

10. The apparatus of claim 9, further comprising a second sample rate converter to receive the processed samples from the first digital processor at the fixed sampling frequency and to output the processed samples at the first sampling frequency.

11. The apparatus of claim 9, wherein the controller is to issue a plurality of ratio control signals to the first sample rate converter during the change of the first sampling frequency from the first rate to the second rate.

12. The apparatus of claim 11, wherein the plurality of ratio control signals are to cause the first sample rate converter to mimic changes in a phase lock loop that generates a clock signal at the first sampling frequency.

13. The apparatus of claim 9, further comprising a microcontroller to generate the frequency change indication responsive to initiation of a second receiver path to receive a second desired channel.

14. The apparatus of claim 13, wherein the apparatus comprises a plurality of receivers integrated in a single semiconductor die.

15. The apparatus of claim 14, wherein the first receiver path is of a first receiver, and a second receiver comprises the second receiver path including a second digitizer to digitize a second incoming signal obtained from the RF signal into second samples, the second digitizer to operate at a second sampling frequency, a third sample rate converter coupled to an output of the second digitizer to receive the second samples at the second sampling frequency and to output the second samples at a second fixed sampling frequency, and a second digital processor to receive and process the second samples at the second fixed sampling frequency.

16. The apparatus of claim 9, wherein the first digital processor includes one or more filters each having a single set of coefficients to enable operation at the fixed sampling frequency.

17. A method comprising:
   receiving, in a controller of a multi-tuner system, a request for a second desired channel while a first tuner of the multi-tuner system is processing a first desired channel;
   determining, in the controller, whether a first clock signal operating at a first rate and used in the first tuner for processing the first desired channel may cause interference with a frequency of the second desired channel; and
   if so, dynamically controlling the first clock signal to operate at a second rate, wherein the first tuner includes a digital datapath that operates according to a second clock signal at a fixed rate that is not dynamically changed.

18. The method of claim 17, further comprising sending, from the controller to a second controller, a frequency change indication to enable the second controller to update a ratio control signal communicated to first and second sample rate converters of the first tuner, the first sample rate converter to receive samples of the first desired channel according to the first clock signal and to output the samples to the digital datapath according to the second clock signal.

19. The method of claim 18, further comprising dynamically adjusting, in the second controller, the ratio control signal to synchronize a change of the ratio control signal with a control change to a phase lock loop that generates the first clock signal, the control change to cause the phase lock loop to generate the first clock signal at the second rate.

20. The method of claim 19, further comprising sequencing, in the second controller, the dynamic adjustment to the ratio control signal with a plurality of steps each corresponding to a step change between the first rate and the second rate.

21. The method of claim 17, further comprising outputting an enable signal to a first module of the digital datapath, and clocking the first module based on the enable signal and the second clock signal, and thereafter propagating the enable signal to a second module of the digital datapath coupled to an output of the first module.

* * * * *